United States Patent [19]

Koyama et al.

[11] 4,283,650
[45] Aug. 11, 1981

[54] PIEZO-VIBRATOR UNIT CERAMIC PACKAGE WITH INTEGRAL CAPACITOR

[75] Inventors: Tamotsu Koyama, Kashihara; Yoshiharu Kuroda, Sakai, both of Japan

[73] Assignee: Sharp Kabushiki Kaisha, Osaka, Japan

[21] Appl. No.: 20,982

[22] Filed: Mar. 16, 1979

[30] Foreign Application Priority Data

Mar. 16, 1978 [JP] Japan ............................ 53/34475[U]

[51] Int. Cl.³ .......................................... H01L 41/08
[52] U.S. Cl. ................................... 310/344; 310/348; 310/318
[58] Field of Search ............... 310/344, 348, 390, 318

[56] References Cited

U.S. PATENT DOCUMENTS

| 3,969,640 | 7/1976 | Staudte | 310/344 X |
| 4,005,321 | 1/1977 | Shibata et al. | 310/348 |
| 4,012,700 | 3/1977 | Besson | 310/348 X |
| 4,110,655 | 8/1978 | Hata | 310/344 |

Primary Examiner—Mark O. Budd
Attorney, Agent, or Firm—Birch, Stewart, Kolasch & Birch

[57] ABSTRACT

A ceramic package includes a ceramic case for installing a piezo-vibrator therein. Capacitors are formed directly on the bottom surface of the ceramic case through the multi-layer printing method. Electrodes of the capacitors also function as input and output electrodes for the piezo-vibrator.

8 Claims, 25 Drawing Figures

PIEZO-VIBRATOR UNIT CERAMIC PACKAGE WITH INTEGRAL CAPACITOR

BACKGROUND AND SUMMARY OF THE INVENTION

The present invention relates to a piezo-vibrator unit incorporated in a ceramic package.

A piezo-vibrator such as a crystal oscillator is employed in a crystal oscillation circuit which is inevitably required in an electronic timepiece. In the conventional crystal oscillation circuit, capacitors are discrete from the crystal oscillator device and are electrically connected to the crystal oscillator device. This increases the number of required elements and complicates manufacture of the crystal oscillation circuit.

Accordingly, an object of the present invention is to provide a crystal oscillator device suited for mass production.

Another object of the present invention is to provide a ceramic package for integrally incorporating a piezo-vibrator element and capacitors.

Still another object of the present invention is to provide a piezo-vibrator unit which is easily installed on a circuit board.

Other objects and further scope of applicability of the present invention will become apparent from the detailed description given hereinafter. It should be understood, however, that the detailed description and specific examples, while indicating preferred embodiments of the invention, are given by way of illustration only, since various changes and modifications within the spirit and scope of the invention will become apparent to those skilled in the art from this detailed description.

To achieve the above objects, pursuant to an embodiment of the present invention, a ceramic package is provided for installing a piezo-vibrator such as a crystal oscillator element therein. Capacitors are formed directly on the rear surface of the ceramic package through the use of multi-layer printing techniques. The upper surface of the ceramic package is covered by a glass plate to seal the piezo-vibrator.

In a preferred form, the entire electrode terminals for the piezo-vibrator element and capacitors are formed on the bottom surface of the ceramic package in order to facilitate the installation of the ceramic package on the circuit board.

BRIEF DESCRIPTION OF THE DRAWINGS

The present invention will be better understood from the detailed description given hereinbelow and the accompanying drawings which are given by way of illustration only, and thus are not limitative of the present invention and wherein.

DESCRIPTION OF THE PREFERRED EMBODIMENTS

Figure 1:
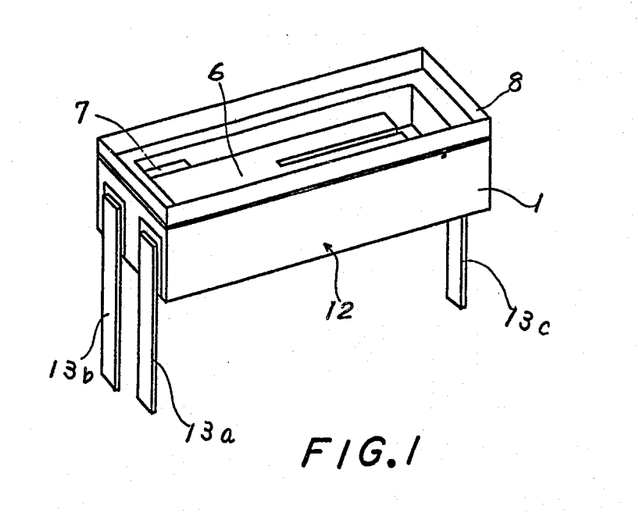
FIG. 1 is a perspective view of an embodiment of a ceramic package of the present invention.
Figure 2:
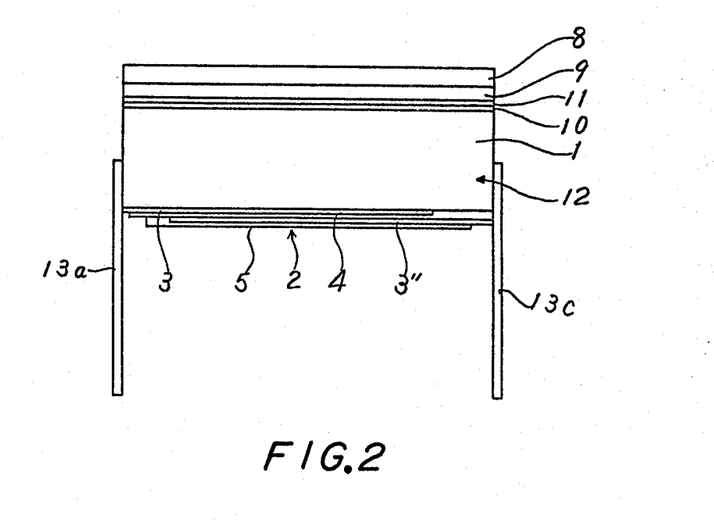
FIG. 2 is a front view of the ceramic package of FIG. 1.
Figure 3:
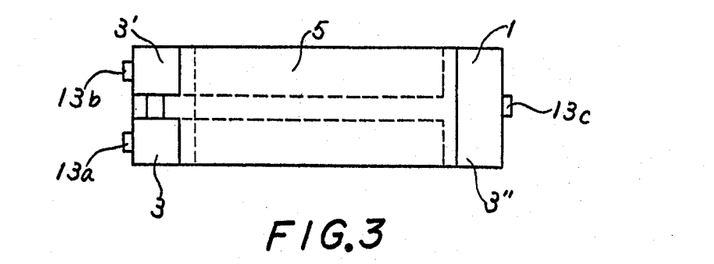
FIG. 3 is a bottom view of the ceramic package of FIG. 1.

FIGS. 1, 2 and 3 show an embodiment of a ceramic package of the present invention for integrally accommodating the crystal oscillator element and capacitors.

The ceramic package of the present invention mainly comprises a ceramic case 1 made of alumina ceramics tolerant of a temperature between 1200° C. and 1500° C. Two capacitors 2 are formed directly on the bottom surface of the ceramic case 1 through the use of multi-layer printing techniques.

More specifically, the capacitors 2 comprise conductive layers 3 and 3' formed directly on the bottom surface of the ceramic case 1 in a desired configuration, and an dielectric layer 4 formed on the conductive layers 3 and 3'. The dielectric layer 4 is formed by painting an alumina ceramic paste to cover the bottom surface of the ceramic case 1 inclusive of the conductive layers 3 and 3' except for left ends thereof. A common electrode layer 3" is formed on the dielectric layer 4 to continuously cover the dielectric layer 4 except for the left end thereof. An insulation protective layer 5 is printed on the common electrode layer 3" so that the common electrode layer 3" is covered by the insulation protective layer 5 except for the right end thereof.

A crystal oscillator element 6 is disposed in the ceramic case 1 and fixed to the ceramic case 1 via a conductive paste 7. The upper open end of the ceramic case 1 is covered by a transparent glass plate 8 which is supported by a metal frame 9 made of Kovar (Fe 54%, Ni 29%, Co 17%). The transparent glass plate 8 is fixed to the ceramic case 1 via the metal frame 9, a solder frame 11 and a metallized portion 10 of the ceramic case 1. In this way, the crystal oscillator element 6 is sealed in a ceramic package 12.

Outer lead electrodes 13a, 13b and 13c are fixed to the ceramic package 12 and electrically connected to the crystal oscillator element 6 and the capacitors 2.

Figure 4:
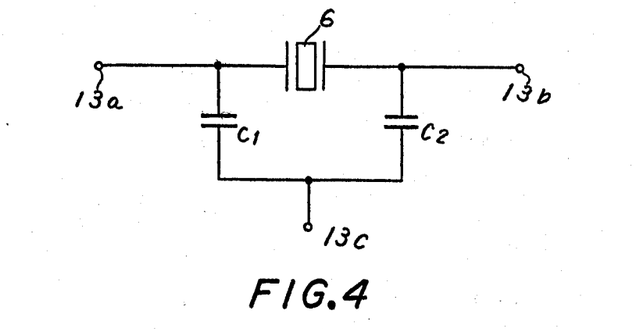
FIG. 4 is a diagram of an equivalent circuit of a crystal oscillator device unit installed on the ceramic package of FIG. 1.

FIG. 4 shows an equivalent circuit of the crystal oscillator device unit of FIGS. 1 to 3.

One terminal of the crystal oscillator element 6 is connected to the outer lead electrode 13a, and the other terminal of the crystal oscillator element 6 is connected to the outer lead electrode 13b. The capacitors 2 include a first capacitor determined by the conductive layer 3 and the common electrode layer 3'', and having a capacitance value $C_1$, and a second capacitor determined by the conductive layer 3' and the common electrode layer 3'', and having a capacitance value $C_2$. One terminal of the first capacitor ($C_1$) is connected to the outer lead electrode 13a, and one terminal of the second capacitor ($C_2$) is connected to the outer lead electrode 13b. The common electrode layer of the capacitors 2 is connected to the outer lead electrode 13c.

Figure 5:
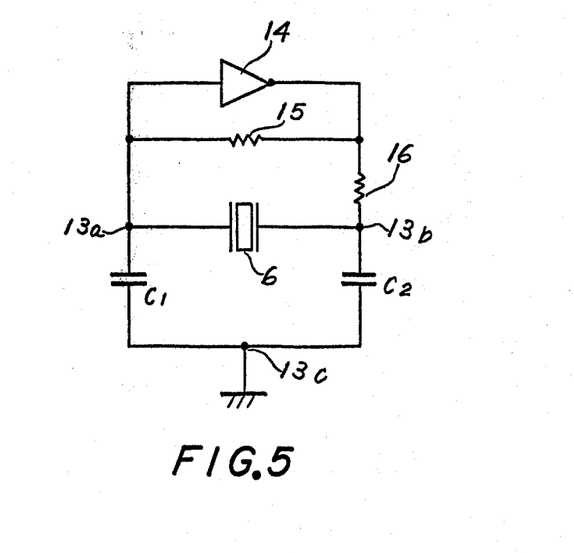
FIG. 5 is a circuit diagram of a crystal oscillator circuit which includes the crystal oscillator device unit of FIG. 4.

FIG. 5 shows an oscillation circuit including the crystal oscillator device unit of FIGS. 1 to 4.

An inverter 14, and resistors 15 and 16 are disposed between the outer lead electrodes 13a and 13b, and the outer lead electrode 13c is grounded. Operation of the oscillation circuit of FIG. 5 is well known in the art and, therefore, the detailed description thereof has been omitted for the purposes of simplicity.

An oscillation frequency of the crystal oscillation circuit can be adjusted through the use of a laser trimming method, wherein a laser beam is applied to the crystal oscillator element 6 through the transparent glass plate 8.

The dielectric layer 4 is made of a material substantially identical with that of the ceramic case 1 and, therefore, the capacitors 2 are tightly attached to the ceramic case 1 even when a temperature varies.

Figure 6:
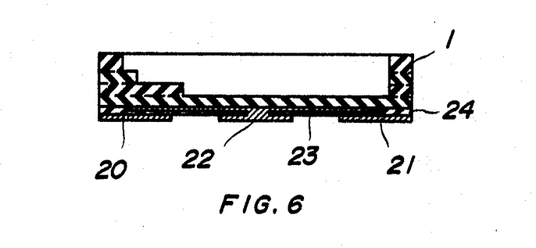
FIG. 6 is a sectional view of another embodiment of a ceramic package of the present invention.
Figure 7:
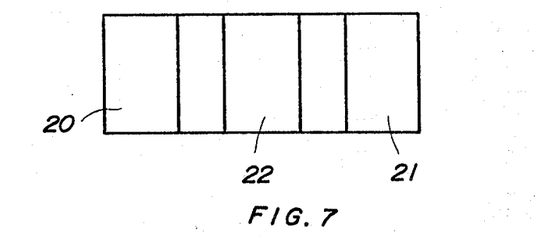
FIG. 7 is a bottom view of the ceramic package of FIG. 6.

FIGS. 6 and 7 show another embodiment of the ceramic package of the present invention.

In this embodiment, the bottom surface of the ceramic package is flat shaped, and three electrodes are formed on the bottom surface of the ceramic package to facilitate installation of the ceramic package on a circuit board. An input electrode 20 corresponds to the outer lead electrode 13a of FIGS. 1 to 5, an output electrode 21 corresponds to the outer lead electrode 13b, and a ground electrode 22 corresponds to the outer lead electrode 13c of FIGS. 1 through 5.

Figure 8:
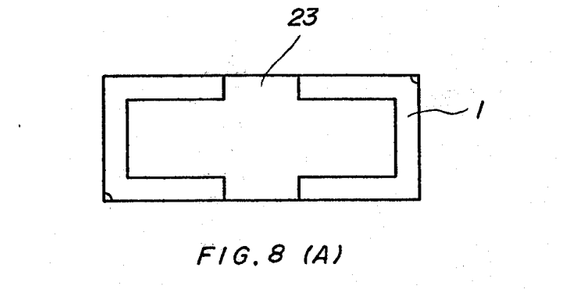
FIGS. 8(A), 8(B) and 8(C) are bottom views showing manufacturing steps of capacitors included in the ceramic package of FIGS. 6 and 7.

FIGS. 8(A), 8(B) and 8(C) show manufacturing steps of the capacitors and three electrodes included in the ceramic package of FIGS. 6 and 7.

A common ground electrode 23 is formed on the bottom surface of the ceramic case 1 in a desired configuration as shown in FIG. 8(A). The common ground electrode 23 is preferably formed by painting or printing a tungsten paste on the bottom surface of the ceramic case 1. An dielectric layer 24 is formed on the common ground electrode 23 as shown in FIG. 8(B). The dielectric layer 24 is formed by printing an alumina ceramic paste on the common ground electrode 23. The dielectric layer 24 is provided with a throughhole opening 241 for electrically connecting the common ground electrode 23 to the ground electrode 22, and cut-away portions 242 through 245 for electrically communicating the crystal oscillator element secured in the ceramic case 1 to the outer circuit. The input electrode 20, the output electrode 21 and the ground electrode 22 are formed on the dielectric layer 24 by printing a tungsten paste on the dielectric layer 24 in a desired configuration as shown in FIG. 8(C).

The common ground electrode 23 and the input electrode 20 form, in combination, the first capacitor, and the common ground electrode 23 and the output electrode 21 form, in combination, the second capacitor.

Figure 9:
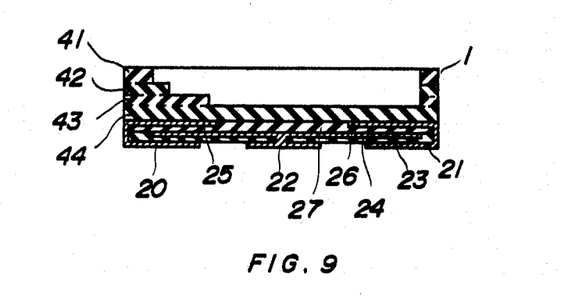
FIG. 9 is a sectional view of still another embodiment of a ceramic package of the present invention.

FIG. 9 shows still another embodiment of the ceramic package of the present invention. Like elements corresponding to those of FIG. 6 are indicated by like numerals.

The embodiment of FIG. 9 further comprises, in addition to the embodiment of FIG. 6, an input inner electrode 25, an output inner electrode 26 and an inner dielectric layer 27. The input electrode 20 is electrically connected to the input inner electrode 25, and the output electrode 21 is electrically connected to the output inner electrode 26, thereby increasing the capacitance values of the first and second capacitors.

FIGS. 10(A) through 10(E) show manufacturing steps of the capacitors included in the ceramic package of FIG. 9.

Figure 10:
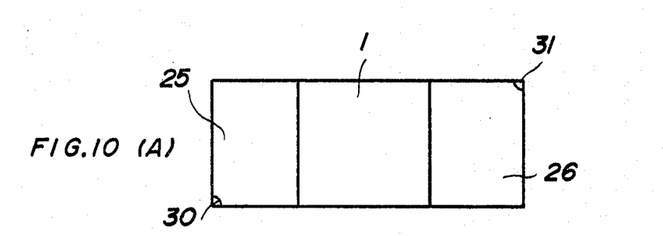
FIGS. 10(A) through 10(E) are bottom views showing manufacturing steps of capacitors included in the ceramic package of FIG. 9.

The input inner electrode 25 and the output inner electrode 26 are formed on the bottom surface of the ceramic case 1 as shown in FIG. 10(A) by printing a tungsten paste. The ceramic case 1 and the electrodes 25 and 26 are provided with cut-away portions 30 and 31 for electrically communicating the crystal oscillator element disposed in the ceramic case 1 with the outer circuit. The inner dielectric layer 27 is formed on the input inner electrode 25 and the output inner electrode 26 as shown in FIG. 10(B) by printing an alumina paste. The inner dielectric layer 27 is provided with cut-away portions 32 and 33 which occupy a slightly larger area than the cut-away portions 30 and 31.

Formation of the common ground electrode 23, the dielectric layer 24 and the three electrodes 20, 21 and 22 is shown in FIGS. 10(C), 10(D) and 10(E). The formation of these layers is similar to that described with reference to FIGS. 8(A) through 8(C). The dielectric layer 24, the input electrode 20 and the output electrode 21 are provided with cut-away portions formed at positions corresponding to the cut-away portions 32 and 33. These cut-away portions are filled with a conductive material, thereby electrically connecting the input electrode 20 to the input inner electrode 25 and the crystal oscillator element disposed in the ceramic case 1, and electrically connecting the output electrode 21 to the output inner electrode 26 and the crystal oscillator element disposed in the ceramic case 1.

The ceramic case 1 comprises four ceramic plates 41, 42, 43 and 44. FIGS. 11 through 14 show the respective ceramic plates under the mass production.

Figure 11:
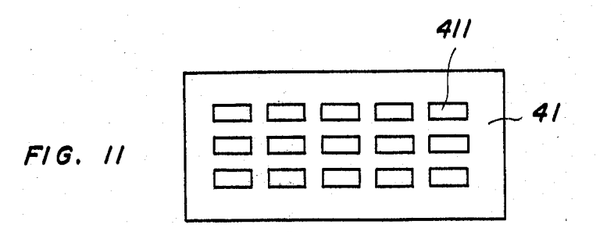
FIGS. 11 through 14 are plan views of ceramic plates which form, in combination, the ceramic package of FIG. 9.

The first ceramic plate 41 is the metallized ceramic plate for fixing the metal frame attached to the transparent glass plate as already discussed with reference to FIG. 2. The metallized ceramic plate 41 is provided with openings 411 for determining the upper open end of the ceramic package.

Figure 12:
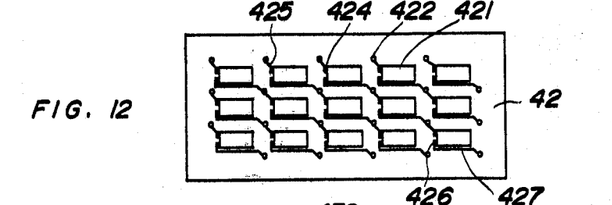

The second ceramic plate 42 has openings 421 which are slightly smaller than the openings 411 formed in the metallized ceramic plate 41. The second ceramic plate 42 is provided with throughhole openings 422, which correspond to the cut-away portions 30 and 31 shown in FIG. 10(A). First terminals 424 are formed on the second ceramic plate 42, and first wiring patterns 425 are formed between the first terminal 424 and the throughhole opening 422. Second terminals 426 are formed on the second ceramic plate 42, and second wiring patterns 427 are formed between the second terminal 426 and the throughhole opening 422. The terminals 424 and 426 are provided for the crystal oscillator element.

Figure 13:
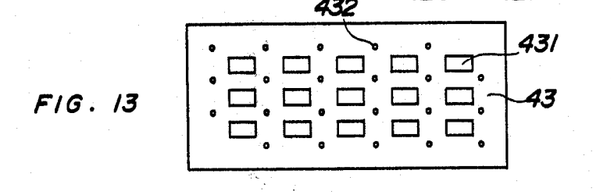

The third ceramic plate 43 is provided with openings 431, which are slightly smaller than the openings 421 formed in the second ceramic plate 42. The third ceramic plate 43 includes throughhole openings 432 formed therein at positions corresponding to the throughhole openings 422 formed in the second ceramic plate 42.

Figure 14:
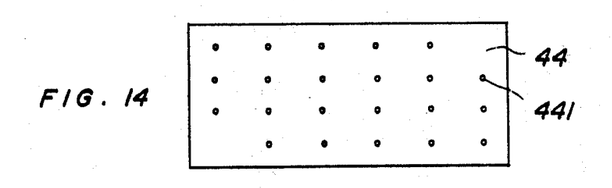
Figure 15:
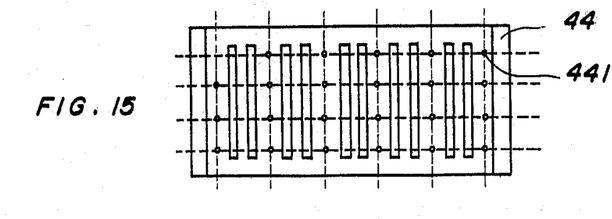
FIG. 15 is a bottom view of the ceramic plate of FIG. 14.

FIG. 14 shows the upper surface of the fourth ceramic plate 44, and FIG. 15 shows the bottom surface of the fourth ceramic plate 44.

The fourth ceramic plate 44 is provided with throughhole openings 441 formed therein at positions corresponding to the throughhole openings 422 formed in the second ceramic plate 42. On the bottom surface of the fourth ceramic plate 44, the capacitors are formed as discussed with reference to FIGS. 10(A) through 10(E).

These four ceramic plates 41, 42, 43 and 44 are stacked and integrally fixed to each other through the use of the sintering method. The tungsten paste is filled in the throughhole openings before the sintering operation to electrically connect the input electrode 20 to the input inner electrode 25 and the first terminal 424, and electrically connect the output electrode 21 to the output inner electrode 26 and the second terminal 425. After the sintering operation, the ceramic plates are divided along the broken lines shown in FIG. 15, thereby providing one ceramic package.

Figure 16:
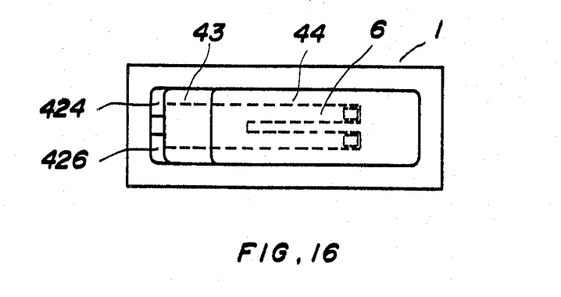
FIG. 16 is a plan view of the ceramic package of FIG. 9.

FIG. 16 shows installation of the crystal oscillator element in the ceramic case.

The crystal oscillator element 6 is fixed to the staired portion of the third ceramic plate 43 through the use of an adhesive material. The crystal oscillator element 6 is electrically connected to the first and second terminals 424 and 426 formed on the second ceramic plate 42 through the use of a silver paste.

Figure 17:
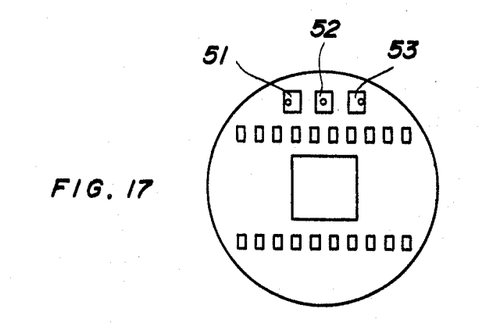
FIG. 17 is a plan view of a circuit board of a wristwatch.

FIG. 17 shows a circuit board of a wristwatch, which is adapted to support the ceramic package of the present invention.

Figure 18:
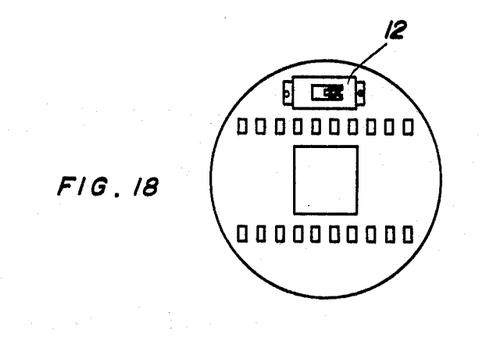
FIG. 18 is a plan view of the circuit board of the wristwatch, which supports the ceramic package of the present invention.

The circuit board includes an output electrode 51, a ground electrode 52, and an input electrode 53 for electrically connecting the ceramic package to the circuit board. The ceramic package of the present invention is secured on the circuit board as shown in FIG. 18.

Figure 19:
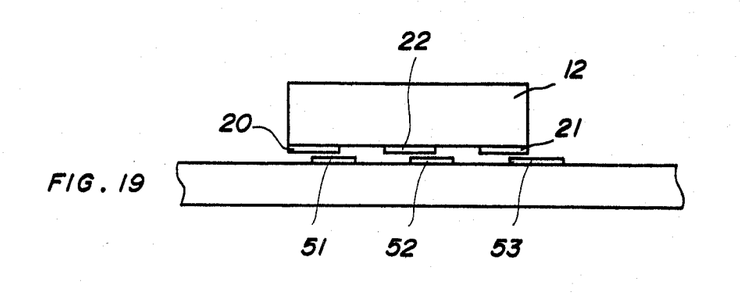
FIG. 19 is a side view showing the installation condition of the ceramic package on the circuit board of FIG. 18.

FIG. 19 shows the condition, where the electrodes formed on the ceramic package are connected to the electrodes formed on the circuit board. In this system, strict positioning of the ceramic package is not required as shown in FIG. 19.

The invention being thus described, it will be obvious that the same may be varied in many ways. Such variations are not to be regarded as a departure from the spirit and scope of the invention, and all such modifications are intended to be included within the scope of the following claims.

What is claimed is:

1. A piezo-electric vibrator assembly comprising:
a ceramic case having sides and a bottom;
a piezo-electric vibrator element disposed within said ceramic case; and
capacitor means formed on the outside of the bottom of said ceramic case, said capacitor means including;
    a common electrode formed on substantially the entire outside surface of the bottom of said ceramic case;
    a dielectric layer formed on substantially the entire outside surface of the bottom at said case and covering said common electrode, said dielectric layer having a throughhole formed therein to facilitate access to said common electrode;
    a first electrode electrically connected to said piezo-electric vibrator element and formed on said dielectric layer, said first electrode and said common electrode forming a first capacitor;
    a second electrode electrically connected to said piezo-electric vibrator element and formed on said dielectric layer, said second electrode and said common electrode layer forming a second capacitor; and
    a third electrode formed on said dielectric layer, said third electrode being electrically connected to said common electrode through said throughhole formed in said dielectric layer;
    said first, second and third electrodes being positioned on the bottom of said case to facilitate ease of connection to outside circuitry.

2. The assembly of claim 1, wherein said capacitors are formed through a multi-layer printing method.

3. The assembly of claim 1, wherein said first and second electrodes are formed on opposing ends of said bottom surface of said ceramic case, and said third electrode is formed at the center of said bottom surface of said ceramic case.

4. The piezo-electric vibrator assembly of claim 1 wherein said first, second and third electrodes are positioned in the same plane and are designed to facilitate interconnection with wiring patterns formed on a separate substrate.

5. A piezo-electric vibrator assembly comprising:
a ceramic case having sides and a bottom;
a piezo-electric vibrator element disposed within said ceramic case; and
capacitor means formed on the outside of said ceramic case bottom, said capacitor means including;
    an input inner electrode formed on a portion of the outside surface of said ceramic case bottom;
    an output inner electrode formed on a portion of the outside surface of said ceramic case bottom not covered by said input inner electrode, said inner input electrode being spaced apart and electrically isolated from said output inner electrode;
    a first dielectric layer formed on substantially the entire outside surface of said ceramic case bottom and covering said inner input electrode and said inner output electrode;
    a common electrode formed on substantially the entire outside surface of said first dielectric layer;
    a second dielectric layer formed on substantially the entire surface of said common electrode, said second dielectric layer having a throughhole formed therein to facilitate access to said common electrode;
    a first outer electrode formed on said second dielectric layer, said first outer electrode being electrically connected to said inner input electrode to form a first electrode assembly electrically connected to said piezo-electric vibrator element, said first electrode assembly and said common electrode forming a first capacitor;
    a second outer electrode formed on said second dielectric layer, said second outer electrode being electrically connected to said inner output electrode to form a second electrode assembly electrically connected to said piezo-electric vibrator element, said second electrode assembly and said common electrode forming a second capacitor; and a third outer electrode formed on said second dielectric layer, said third outer electrode being electrically connected to said common electrode through said throughhole formed in said dielectric layer.

6. The piezo-electric vibrator assembly of claim 5 wherein said first, second and third outer electrodes are positioned on the bottom of said case to facilitate ease of connection to outside circuitry.

7. The assembly of claim 5 wherein said capacitors are formed through a multilayer printing method.

8. The assembly of claim 6 wherein the first, second and third outer electrodes are positioned in the same plane and are designed to facilitate interconnection with wiring patterns formed on a separate substrate.

* * * * *